United States Patent [19]

Sasaki

[11] Patent Number: 5,358,666
[45] Date of Patent: Oct. 25, 1994

[54] OHMIC ELECTRODE MATERIALS FOR SEMICONDUCTOR CERAMICS AND SEMICONDUCTOR CERAMICS ELEMENTS MADE THEREOF

[75] Inventor: Kiyomi Sasaki, Nagaokakyo, Japan

[73] Assignee: Murata Manufacturing Co., Ltd., Japan

[21] Appl. No.: 131,435

[22] Filed: Oct. 4, 1993

Related U.S. Application Data

[60] Continuation of Ser. No. 902,524, Jun. 22, 1992, abandoned, which is a division of Ser. No. 797,308, Nov. 25, 1991, abandoned.

[30] Foreign Application Priority Data

Nov. 30, 1990 [JP] Japan ................... 2-340860

[51] Int. Cl.$^5$ ............... H01B 1/00; H01B 1/04
[52] U.S. Cl. .................. 252/512; 252/518; 501/19; 501/32; 501/76
[58] Field of Search ............ 252/512, 513, 518, 500; 501/15, 19, 32, 76

[56] References Cited

U.S. PATENT DOCUMENTS

| | | | |
|---|---|---|---|
| 3,561,986 | 2/1971 | Broemer et al. | 501/76 |
| 4,053,864 | 10/1977 | Rodriguez et al. | 338/22 |
| 4,148,761 | 4/1979 | Kazmierowicz | 252/512 |
| 4,938,244 | 7/1990 | Kumada et al. | 136/225 |
| 5,053,283 | 10/1991 | Brown | 252/518 |

OTHER PUBLICATIONS

"Preparation of Aluminum Conducting Paste for Solar Panels" Dubey (India) IN 159860 A (13 Jun. 1987).

*Primary Examiner*—Paul Lieberman
*Assistant Examiner*—M. Kopec
*Attorney, Agent, or Firm*—Ostrolenk, Faber, Gerb & Soffen

[57] ABSTRACT

An ohmic electrode material for semiconductor ceramics comprises 48–96 weight % of aluminum and 4–52 weight % of silicon. A semiconductor ceramics element includes a semiconductor ceramics such as that of barium titanate system semiconductor ceramics and on the surface of the semiconductor ceramics is formed an ohmic electrode from the ohmic electrode material.

8 Claims, No Drawings ness of the present invention will become more apparent from the following detailed description of the examples of the present invention.
OHMIC ELECTRODE MATERIALS FOR SEMICONDUCTOR CERAMICS AND SEMICONDUCTOR CERAMICS ELEMENTS MADE THEREOF This is a continuation of application Ser. No. 07/902,524 filed on Jun. 22, 1992 now abd., which is a division of application Ser. No. 07/797,308 filed Nov. 25, 1991, now abandoned.

BACKGROUND OF THE INVENTION

1. Field of the Invention

The present invent ion relates to ohmic electrode materials and semiconductor ceramics elements made thereof and, in particular, to ohmic electrode materials for semiconductor ceramics having an ohmic contact and semiconductor ceramics elements made thereof such as positive temperature coefficient thermistors, varistors and resistors.

2. Description of the Prior Art

As electrode materials of various semiconductor ceramics such as barium titanate system semiconductor ceramics, zinc oxide system semiconductor ceramics, strontium titanate system semiconductor ceramics, tin oxide system semiconductor ceramics, iron oxide system semiconductor ceramics, titanium oxide system semiconductor ceramics and nickel oxide system semiconductor ceramics are used electrode materials having an ohmic contact.

As such electrode materials having an ohmic contact are known, among others, In-Ga alloy, electroless deposition of nickel, ohmic silver paste and aluminum paste.

Of these electrode materials, one comprising aluminum paste is applied to the surface of a semiconductor ceramics by, for example, printing and then baked at 600°–800° C. for electrodes to be formed thereby. This aluminum electrode is lowest in specific resistance of all base metals, also being lowest in manufacturing cost and thus presenting the cheapest base metal electrode material.

The aluminum electrode with its short life in a moist atmosphere, however, has a problem of having its resistance increasing with increasing ambient humidity, and it is not yet in practical use.

SUMMARY OF THE INVENTION

It is, therefore, a principal object of the present invention to provide an ohmic electrode material for semiconductor ceramics having a good ohmic contact and a good resistance to moisture.

Another object of the present invention is to provide a semiconductor ceramics element having an ohmic electrode which have a good ohmic contact and a good resistance to moisture.

An ohmic electrode material for semiconductor ceramics according to the present invention comprises 48–96 weight % of aluminum and 4–52 weight % of silicon.

A semiconductor ceramics element according to the present intention includes a semiconductor ceramics and an ohmic electrode formed on the surface thereof, and the ohmic electrode comprises 48–96 weight % of aluminum and 4–52 weight % of silicon.

That the proportions of aluminum and silicon are limited in the aforementioned ranges is for the fact that no good ohmic contact is attainable with simultaneous deterioration of resistance to moisture when aluminum content is less than 48 weight % and silicon content is more than 52 weight %. Also to be noted is that the resistance to moisture deteriorates when the aluminum content is more than 96 weight % and the silicon content is less than 4 weight %.

This is why the proportions of aluminum and silicon in the electrode material are limited to ranges of 48–96 weight % and 4–52 weight % respectively.

According to the present invention, an ohmic electrode material for semiconductor ceramics having a good ohmic contact and a good resistance to moisture is obtained.

Further, according to the present invention, a semiconductor ceramics element, which has an electrode having a good ohmic contact and a good resistance to moisture, is obtained.

These objects and other objects, features and advantages of the present invention will become more apparent from the following detailed description of the examples of the present invention.

DESCRIPTION OF THE PREFERRED EMBODIMENTS

EXAMPLE 1

First aluminum powder and silicon powder were prepared and these were mixed in the ratios shown in Table 1 to obtain metal powders. The aluminum powder was 5–30 µm in particle size and 10 µm in mean particle size and the silicon powder was 0.5–10.0 µm in particle size and 6 µm in mean particle size.

These metal powders were mixed with low-melting glass frit and organic vehicle to prepare pastes thereof respectively. As low-melting glass frit was used lead borosilicate series glass frit and as organic vehicle ethyl cellulose dissolved in α-terpineol. The metal powder, the low-melting glass frit and the organic vehicle were mixed at proportions of 70 weight %, 10 weight % and 20 weight % respectively.

Meanwhile, on both sides of a disc-like barium titanate system semiconductor ceramics 13 mmφ in size and 200 Ω in resistance were rubbed against with In-Ga alloy to form electrodes and this was used as standard sample for measurement of the ohmic contact.

On both sides of the barium titanate system semiconductor ceramics in the same construction as mentioned above pastes prepared at the ratios shown in Table 1 were applied by printing, then they were baked for 30 minutes in the air at 600° C. or 800° C. and the electrodes thus formed were used as samples for measurement of ohmic contact.

Then, the resistances of the standard sample and each sample were measured with an ohm-meter. Resistance measurement was then taken at 25° C.±0.5° C. with the measuring terminals of the ohm-meter applied to the electrodes on both sides of the semiconductor ceramics.

Next, the ratio of each sample's resistance to that of the standard sample was calculated. The ratios are shown in Table 1 as ohmic property. The smaller this resistance ratio, the better the ohmic contact, where this ratio is 1.3 or less, it possesses a good ohmic contact.

Thereafter, two counter electrodes of silver were formed on a rectangular alumina plate 20 mm×15 mm×4 mm in size over a gap of 4 mm, the aforementioned each paste was printed or coated so as to bridge the counter electrodes and an electrode was formed by baking in the air for 30 minutes at 600° C. or 800° C. and the electrode so formed was taken as sample for measurement of specific resistance.

A conductivity meter was connected between the counter electrodes of each sample and measurement was taken of the specific resistance of each sample's electrode. Its result is shown in Table 1.

In order to assess resistance moisture the samples as mentioned above taken for measurement of the degree of ohmic mode, they were left standing for 2,000 hours in an atmosphere of 60° C. and relative humidity of 95%, and the change ratios were determined with respect to the initial electrode's ohmic property and specific resistance. The result is shown in Table 1.

In the Table 1 the asterisked samples are out the scope of this invention, others are those falling in the scope of the invention.

As seen from Table 1, when the composition is 24 weight % of aluminum and 76% of silicon as sample No. 1—1, ohmic property is not attainable at a baking temperature of 600° C., the specific resistance assumes a high value, the rate of change of ohmic property is increased and the specific resistance infinitely large. With sample No. 1-2 ohmic property was not attainable at a baking temperature of 800° C. and the specific resistance, too, assumed a high value.

With samples Nos. 7-1 and 7-2 which were made of aluminum only ohmic property was attained and the specific resistance was low but noted was deterioration of the resistance to moisture.

In contrast thereto, good ohmic property was attainable with those within the scope of this invention, the specific resistance was low and, further, the resistance to moisture was excellent.

EXAMPLE 2

In this example examination was made to see if the comparative merits and demerits of electrode depend on the kind of glass frit in the electrode material.

As seen from Table 2, as glass frits in the electrode material in this example were used lead borosilicate, zinc borosilicate, lead zinc borosilicate (obtained by substituting with zinc oxide 20 weight % of lead oxide in lead borosilicate), lead zinc borosilicate (obtained by substituting with zinc oxide 80 weight % of lead oxide in lead borosilicate) and bismuth borosilicate. In this example a paste was obtained by mixing 20 weight % of organic vehicle to 80 weight % of solid component comprising principal component of aluminum and silicon mixed with glass frit. And from this paste were made electrodes in the same way as example 1. The paste baking temperature was 600° C.

In the same way as example 1 individual properties were measured. The result is shown in Table 2.

As seen from the measured data given in Table 2, electrode's ohmic property can be improved by using as glass frit lead borosilicate, zinc borosilicate or lead zinc borosilicate but bismuth borosilicate cannot be used for this purpose.

The glass frit content of electrode material may preferably in a range of 10-50 weight %. If its content is less than 10 weight %, the resistance to moisture gets worse with simultaneous deterioration of adhesion strength, while, if its content is in excess of 50 weight %, the specific resistance rises to prevent with attainment of ohmic property.

EXAMPLE 3

In this example measurement of properties with respect to migration was about the electrode of the present invention and that of the prior art.

First as electrode materials according to the present invention pastes were obtained by adding 20 weight % of organic vehicle to 80 weight % of solid component comprising principal component and glass frit prepared according to the composition shown in Samples Nos., 9-1 to 9-4 of Table 2. And with them in the same way as the examples above electrodes were formed on both sides of a disc-like semiconductor ceramics. In this case the paste was baked at 600° C.

Meanwhile, as a conventional example a paste was obtained by adding 20 weight % of organic vehicle to 80% of solid component comprising silver and zinc as principal component and glass frit mixed in the ratio shown in Sample No. 9-5. With this paste, in the same way as described above, each one electrode was prepared on both sides of the disc-like semiconductor ceramics.

As another conventional example each one two-layer electrode was prepared on both sides of a disc-like semiconductor ceramics, each comprising a lower layer of nickel electroless plating film and an upper layer of silver-baked electrode.

With each of the aforementioned electrodes measurement was made of the properties with respect to migration. In the test 200 g of concentrated hydrochloric acid was diluted with 200 g of pure water and, with this filled in a bottom of desiccator and a semiconductor ceramics (sample) with electrodes set in upside of the desiccator, 140 V was applied between the electrodes for 100 hours. Those with which short-circuiting took place as the electrodes were moved on both sides of the sample were rated as "bad" and those with no indication of short-circuiting were rated as "good." The result is shown in Table 3.

As is apparent from the result shown in Table 3, the electrode material according to the present invention is effective for preventing migration.

Lead borosilicate as glass frit comprises
2.0–45.0 weight % of boron oxide ($B_2O_3$)
1.0–25.0 weight % of silicon oxide ($SiO_2$) and
40.0–87.0 weight % of lead oxide (PbO),
and zinc borosilicate as glass frit comprises
2.0–45.0 weight % of boron oxide ($B_2O_3$)
1.0–25.0 weight % of silicon oxide ($SiO_2$) and
10.0–60.0 weight % of zinc oxide (ZnO).

Lead zinc borosilicate as glass frit is obtained by substituting with zinc oxide part of the lead oxide included in the aforementioned lead borosilicate.

In the aforementioned example barium titanate system semiconductor ceramics is used as semiconductor ceramics but in the present invention can also be used semiconductor ceramics of, for example, zinc oxide system, strontium titanate system, tin oxide system, iron oxide system, titanium oxide system and nickel oxide system.

Although the present invention has been described in detail, it is apparent that it is for the purpose of illustration only and is by no means for limiting the scope of the invention. The spirit and the scope of this invention are limited only by the wording of the appended claims.

TABLE 1

| Sample No. | Electrode Material (wt %) Al | Electrode Material (wt %) Si | Baking Temperature (°C.) | Ohmic Property | Specific Resistance (Ω) | Change Ratio (%) of Resistance after 2,000 (hrs) Ohmic Property | Change Ratio (%) of Resistance after 2,000 (hrs) Specific Resistance |
|---|---|---|---|---|---|---|---|
| 1-1* | 24 | 76 | 600 | 170 | 116000 | 91.1 | ∞ |
| 1-2* | 24 | 76 | 800 | 30.8 | 132 | 153 | 177 |
| 2-1 | 48 | 52 | 600 | 1.66 | 3.59 | 133 | 1.03 |
| 2-2 | 48 | 52 | 800 | 0.940 | 4.79 | 2.36 | 159 |
| 3-1 | 60 | 40 | 600 | 1.21 | 0.813 | 7.74 | 3.58 |
| 3-2 | 60 | 40 | 800 | 0.921 | 3.300 | 1.00 | 1.36 |
| 4-1 | 72 | 28 | 600 | 1.18 | 0.459 | 1.16 | 2.85 |
| 4-2 | 72 | 28 | 800 | 0.915 | 1.600 | 1.08 | 1.39 |
| 5-1 | 84 | 16 | 600 | 1.01 | 0.175 | 1.03 | 1.65 |
| 5-2 | 84 | 16 | 800 | 0.968 | 1.940 | 1.02 | 0.742 |
| 6-1 | 96 | 4 | 600 | 1.02 | 0.139 | 1.03 | 0.957 |
| 6-2 | 96 | 4 | 800 | 1.03 | 2.57 | 1.03 | 0.879 |
| 7-1* | 100 | 0 | 600 | 1.29 | 0.249 | 2.23 | 1.80 |
| 7-2* | 100 | 0 | 800 | 1.59 | 5.06 | 1.23 | 0.318 |

*indicates ranges outside the invention

TABLE 2

| Sample No. | Electrode Material (wt %) Principal Component Al | Electrode Material (wt %) Principal Component Si | Content of Principal Component | Content of Glass Frit | Glass Frit Composition | Ohmic Property | Specific Resistance (Ω) | Change Ratio (%) of Resistance Ohmic Property | Change Ratio (%) of Resistance Specific Resistance |
|---|---|---|---|---|---|---|---|---|---|
| 8-1 | 76 | 24 | 75 | 25 | A | 1.118 | 0.157 | 1.03 | 0.989 |
| 8-2 | 76 | 24 | 75 | 25 | C | 1.074 | 0.174 | 0.963 | 1.04 |
| 8-3 | 84 | 16 | 90 | 10 | A | 1.13 | 0.22 | 1.06 | 4.23 |
| 8-4 | 84 | 16 | 90 | 10 | B | 1.23 | 0.14 | 1.29 | 4.79 |
| 8-5 | 84 | 16 | 70 | 30 | C | 1.103 | 0.217 | 1.04 | 0.814 |
| 8-6 | 84 | 16 | 90 | 10 | D | 1.02 | 0.16 | 1.15 | 2.12 |
| 8-7 | 84 | 16 | 90 | 10 | E | 45.12 | 0.23 | 275.49 | 9.35 |
| 8-8 | 92 | 8 | 75 | 25 | C | 1.159 | 0.100 | 0.994 | 1.46 |
| 8-9 | 92 | 8 | 70 | 30 | C | 1.084 | 0.181 | 1.03 | 1.27 |

Glass Frit Composition
A: Lead Borosilicate
B: Zinc Borosilicate
C: Lead Zinc Borosilicate (obtained by substituting with Zinc Oxide 20 wt % of Oxide Lead in Lead Borosilicate)
D: Lead Zinc Borosilicate (obtained by substituting with Zinc Oxide 80 wt % of Oxide Lead in Lead Borosilicate)
E: Bismuth Borosilicate

TABLE 3

| Sample No. | Electrode Material (wt %) Principal Component Al | Electrode Material (wt %) Principal Component Si | Content of Principal Component | Content of Glass Frit | Glass Frit Composition | Migration Property |
|---|---|---|---|---|---|---|
| 9-1 | 84 | 16 | 90 | 10 | C | Good |
| 9-2 | 84 | 16 | 75 | 25 | C | Good |
| 9-3 | 84 | 16 | 65 | 35 | C | Good |
| 9-4 | 84 | 16 | 50 | 50 | C | Good |
| 9-5 | 70 wt % of Silver 30 wt % of Zinc | | 90 | 10 | A | Bad |
| 9-6 | Nickel electroless plating Film (Lower Layer) Silver-baked Electrode (Upper Layer) | | | | A | Bad |

Glass Frit Composition
A: Lead Borosilicate
C: Lead Zinc Borosilicate (obtained by substituting with Zinc Oxide 20 wt % of Oxide Lead in Lead Borosilicate)

What is claimed is:

1. A semiconductor ceramic element including a semiconductor ceramic body and an ohmic electrode formed on the surface of said semiconductor ceramic body, wherein said ohmic electrode comprises 10–50 weight % of glass frit selected from the group consisting of zinc borosilicate and lead zinc borosilicate, in addition to a conductive component comprising 48–96 weight % of aluminum and 4–52 weight % of silicon.

2. A semiconductor ceramics element according to claim 1, wherein said ohmic electrode comprises 72–96 weight % of aluminum and 4–28 weight % of silicon.

3. A semiconductor ceramic element according to claim 1, wherein said ohmic electrode contains 10–50 weight % of glass frit in addition to the conductive component comprising 72–96 weight % of aluminum and 4–28 weight % of silicon.

4. A semiconductor ceramic element according to claim 1, wherein said semiconductor ceramic is selected from the group consisting of barium titanate system semiconductor ceramics, zinc oxide system semiconductor ceramics, strontium titanate system semiconductor ceramics, tin oxide system semiconductor ceramics, iron oxide system semiconductor ceramics, titanium oxide system semiconductor ceramics and nickel oxide system semiconductor ceramics.

5. A semiconductor ceramic element according to claim 2, wherein said semiconductor ceramic is selected from the group consisting of barium titanate system semiconductor ceramics, zinc oxide system semiconductor ceramics, strontium titanate system semiconductor ceramics, tin oxide system semiconductor ceramics, iron oxide system semiconductor ceramics, titanium oxide system semiconductor ceramics and nickel oxide system semiconductor ceramics.

6. A semiconductor ceramic element according to claim 3, wherein said semiconductor ceramic is selected from the group consisting of barium titanate system semiconductor ceramics, zinc oxide system semiconductor ceramics, strontium titanate system semiconductor ceramics, tin oxide system semiconductor ceramics, iron oxide system semiconductor ceramics, titanium oxide system semiconductor ceramics and nickel oxide system semiconductor ceramics.

7. A semiconductor ceramic element according to claim 1, wherein said frit is zinc borosilicate comprising
2.0–45.0 weight % of boron oxide ($B_2O_3$),
1.0–25.0 weight % of silicon oxide ($SiO_2$), and
10.0–60.0 weight % of zinc oxide (ZnO).

8. A semiconductor ceramic element according to claim 1, wherein said frit is lead zinc borosilicate comprising
2.0–45.0 weight % of boron oxide ($B_2O_3$),
1.0–25.0 weight % of silicon oxide ($SIO_2$), and
8.0–69.6 weight % of lead oxide (PbO), and
8.0–69.6 weight % zinc oxide (ZnO).

* * * * *